(12) United States Patent
Takahashi et al.

(10) Patent No.: US 10,367,433 B2
(45) Date of Patent: Jul. 30, 2019

(54) POWER GENERATING APPARATUS

(71) Applicant: Murata Manufacturing Co., Ltd., Nagaokakyo-shi, Kyoto-fu (JP)

(72) Inventors: Kouhei Takahashi, Nagaokakyo (JP); Chikahiro Horiguchi, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 660 days.

(21) Appl. No.: 15/131,377

(22) Filed: Apr. 18, 2016

(65) Prior Publication Data

US 2016/0233796 A1    Aug. 11, 2016

Related U.S. Application Data

(63) Continuation of application No. PCT/JP2014/077199, filed on Oct. 10, 2014.

(30) Foreign Application Priority Data

Nov. 12, 2013 (JP) ................................. 2013-234122

(51) Int. Cl.
| | |
|---|---|
| *H02N 2/18* | (2006.01) |
| *H01L 41/113* | (2006.01) |
| *H01L 41/12* | (2006.01) |
| *H01L 41/04* | (2006.01) |

(52) U.S. Cl.
CPC ............ *H02N 2/18* (2013.01); *H01L 41/042* (2013.01); *H01L 41/113* (2013.01); *H01L 41/1134* (2013.01); *H01L 41/125* (2013.01)

(58) Field of Classification Search
CPC .. H01L 41/125; H01L 41/113; H01L 41/1134; H02N 2/18
See application file for complete search history.

(56) References Cited

U.S. PATENT DOCUMENTS

| | | | |
|---|---|---|---|
| 2014/0097709 A1 | 4/2014 | Ueno et al. | |
| 2015/0155471 A1* | 6/2015 | Furukawa | H01L 41/125 310/26 |
| 2018/0316244 A1* | 11/2018 | Fukumoto | H02K 7/1861 |

FOREIGN PATENT DOCUMENTS

| | | |
|---|---|---|
| JP | H0412681 A | 1/1992 |
| JP | 2000197373 A | 7/2000 |
| JP | 2003111445 A | 4/2003 |
| JP | 2004201376 A | 7/2004 |
| JP | 2005229655 A | 8/2005 |

(Continued)

OTHER PUBLICATIONS

International Search Report issued for PCT/JP2014/077199, dated Dec. 22, 2014.

(Continued)

*Primary Examiner* — J. San Martin
(74) *Attorney, Agent, or Firm* — Arent Fox LLP

(57) ABSTRACT

A power generating apparatus includes a power generating element, a lever mechanism including a force point, a support point, and an action point, a first magnetic body disposed on the lever mechanism, and a second magnetic body having magnetic characteristics of being attracted to the first magnetic body. Upon the lever mechanism being pressed, the action point applies a load to the power generating portion and the first magnetic body approaches the second magnetic body while being attracted to the second magnetic body.

20 Claims, 10 Drawing Sheets

(56) References Cited

FOREIGN PATENT DOCUMENTS

| | | | |
|---|---|---|---|
| JP | 2006136185 A | 5/2006 | |
| JP | 2011083174 A | 4/2011 | |
| JP | 2013219940 A | 10/2013 | |
| JP | 2014023367 A * | 2/2014 | ........... H01L 41/125 |
| WO | WO 2012/157246 A1 | 11/2012 | |

OTHER PUBLICATIONS

Written Opinion of the International Searching Authority issued for PCT/JP2014/077199, dated Dec. 22, 2014.

* cited by examiner

POWER GENERATING APPARATUS

CROSS-REFERENCE TO RELATED APPLICATIONS

The present application is a continuation of PCT/JP2014/077199 filed Oct. 10, 2014, which claims priority to Japanese Patent Application No. 2013-234122, filed Nov. 12, 2013, the entire contents of each of which are incorporated herein by reference.

FIELD OF THE INVENTION

The present invention relates to a power generating apparatus that generates power using a lever mechanism.

BACKGROUND

Japanese Unexamined Patent Application Publication No. 2003-111445 (Patent Document 1) discloses a power generating apparatus including a piezoelectric element and a lever mechanism. Power is generated by the piezoelectric element deforming. A load applied to the lever mechanism is amplified by the lever mechanism and applied to the piezoelectric element. Employing the lever mechanism makes it possible to efficiently deform the piezoelectric element.

Japanese Unexamined Patent Application Publication No. 2005-229655 (Patent Document 2) discloses a power generating apparatus including a piezoelectric element and a plurality of magnets. Each magnet can rotate, and as a result of the rotation, is repeatedly attracted to and repulsed from the other magnet. A force produced by the attraction and repulsion is applied to the piezoelectric element as a load using a spring. The piezoelectric element deforms under the load applied from the spring.

Patent Document 1: Japanese Unexamined Patent Application Publication No. 2003-111445.

Patent Document 2: Japanese Unexamined Patent Application Publication No. 2005-229655.

SUMMARY OF THE INVENTION

It is an object of the present invention to provide a power generating apparatus capable of deforming a power generating element efficiently.

A power generating apparatus according to the present invention includes a power generating element that generates power in response to a load being applied thereto; a lever mechanism, including a force point, a support point, and an action point disposed so as to face the power generating portion, that pivots about the support point upon the force point being pressed in a direction that brings the action point toward the power generating portion; a first magnetic body, provided on the lever mechanism, that pivots integrally with the lever mechanism central to the support point; and a second magnetic body having magnetic characteristics of being attracted to the first magnetic body. Here, upon the force point being pressed, the action point applies the load to the power generating portion according to the principle of leverage, and the first magnetic body approaches the second magnetic body while being attracted to the second magnetic body.

Preferably, the power generating portion includes a piezoelectric element. Preferably, the power generating portion includes a magnetostrictor.

Preferably, a distance between the support point and the first magnetic body is greater than a distance between the support point and the action point.

Preferably, the first magnetic body makes contact with the second magnetic body when the lever mechanism finishes pivoting in the direction that brings the action point toward the power generating portion.

Preferably, an opposing force produced by deformation of the power generating portion acts on the lever mechanism when the lever mechanism finishes pivoting in the direction that brings the action point toward the power generating portion, and the opposing force is weaker than a magnetic coupling force between the first magnetic body and the second magnetic body.

Preferably, a pivoting range of the lever mechanism includes a first pivoting range and a second pivoting range located on a side farther than the first pivoting range in the direction that brings the action point toward the power generating portion, and a force required to displace the force point increases in the first pivoting range and decreases in the second pivoting range.

Preferably, the power generating portion includes a power generating element and a pressing portion that directly presses the power generating element, and the pressing portion is provided between the power generating element and the lever mechanism.

According to the configurations described above, the power generating portion can be deformed more efficiently than conventional designs by using the lever mechanism and the magnetic bodies.

DETAILED DESCRIPTION OF EMBODIMENTS

Figure 1:
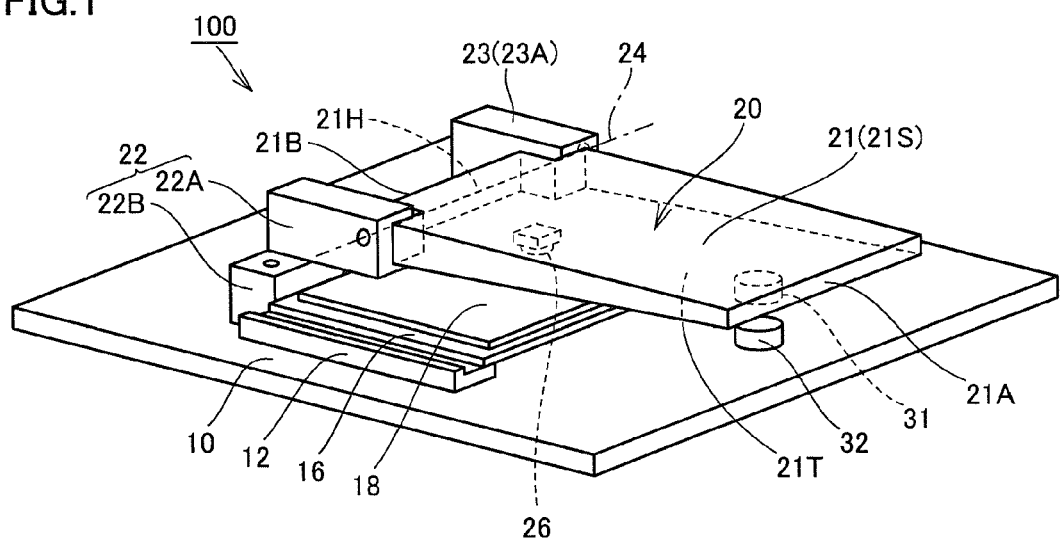
FIG. 1 is a perspective view illustrating a power generating apparatus according to a first embodiment.

Embodiments of the present invention will be described hereinafter with reference to the drawings. References to numbers, amounts, and the like are not intended to limit the scope of the present invention to those numbers, amounts, and the like unless explicitly stated. Identical and corresponding components may be given the same reference numerals and redundant descriptions thereof may be omitted.

First Embodiment

Figure 2:
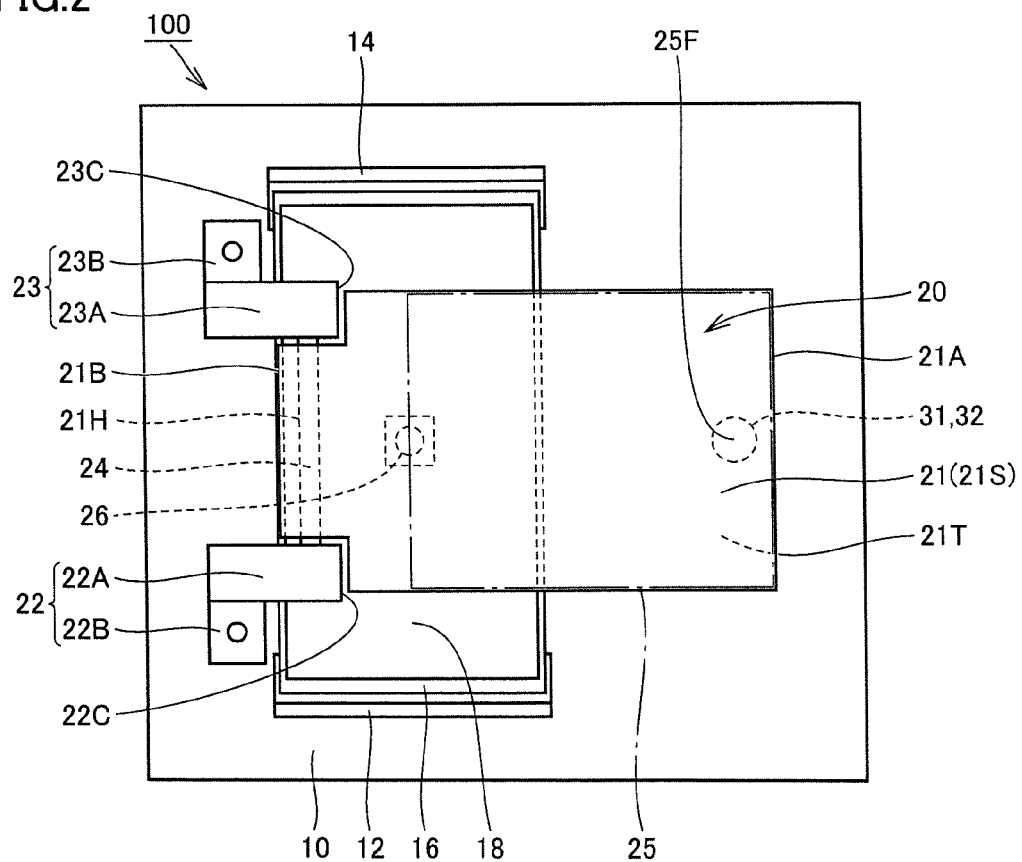
FIG. 2 is a plan view illustrating the power generating apparatus according to the first embodiment.
Figure 3:
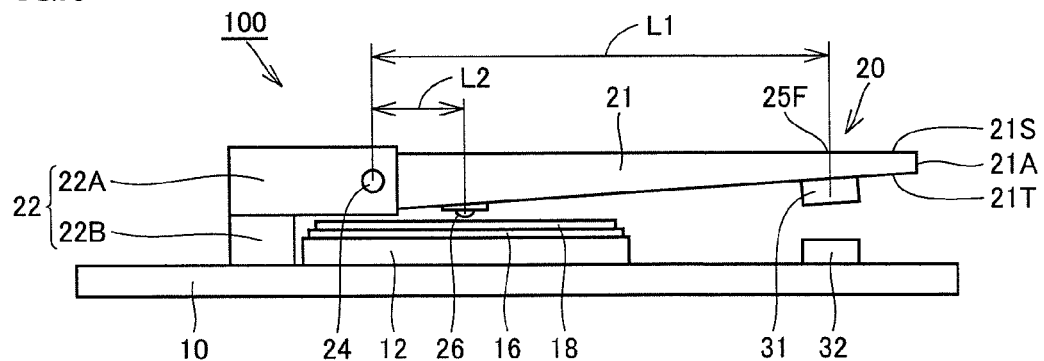
FIG. 3 is a side view illustrating the power generating apparatus according to the first embodiment.
Figure 4:
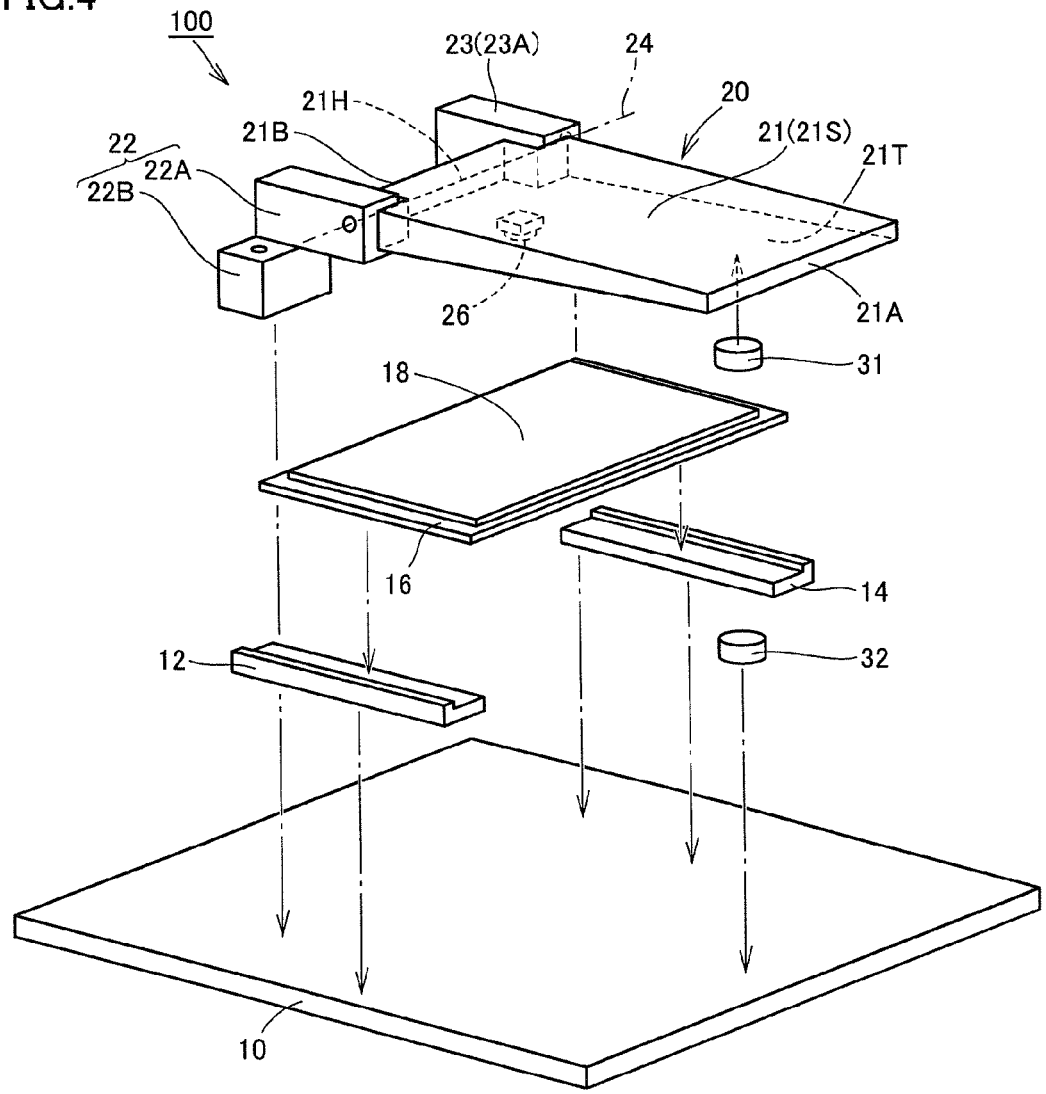
FIG. 4 is a perspective view illustrating the power generating apparatus according to the first embodiment in an exploded state.

A power generating apparatus 100 will be described with reference to FIGS. 1 to 8. FIGS. 1 to 3 are a perspective view, a plan view, and a side view, respectively, illustrating the power generating apparatus 100. FIG. 4 is a perspective view illustrating the power generating apparatus 100 in an exploded state. As illustrated in FIGS. 1 to 4, the power generating apparatus 100 includes a base 10, anchoring members 12 and 14 (see FIGS. 2 and 4), a metal plate 16, a piezoelectric element 18 (power generating element or portion) serving as a power generating portion, a lever mechanism 20, a magnet 31 (a first magnetic body), and a magnet 32 (a second magnetic body).

The base 10 has a flat plate shape, and is formed from a resin, for example. The base 10 may form part (a side wall or the like) of a housing that houses the power generating apparatus 100. The anchoring members 12 and 14 are metal members, for example, and support the metal plate 16 at both ends in a lengthwise direction thereof. The anchoring members 12 and 14 are separated from each other by a gap equivalent to the length of the metal plate 16 and are anchored upon the base 10.

The metal plate 16 and the piezoelectric element 18 have thin plate shapes. The metal plate 16 and the piezoelectric element 18 are bonded to each other to form a unimorph structure. The metal plate 16 is formed from an alloy such as Fe-42Ni, for example. The piezoelectric element 18 is supported by the anchoring members 12 and 14 with the metal plate 16 interposed therebetween. Electrodes (not shown) are provided on front and rear surfaces of the piezoelectric element 18. The piezoelectric element 18 generates a voltage when a load is applied to the piezoelectric element 18 and the piezoelectric element 18 is deformed. The voltage generated by the piezoelectric element 18 is obtained through the electrodes on the front and rear surfaces of the piezoelectric element 18, a lead wire (not shown), and the like.

Piezoelectric elements are typically formed from, for example, a PZT-based ceramic material (PZT), and have characteristics weak to tensile stress and strong to compressive stress. Even in the case where the piezoelectric element 18 is formed from PZT, bonding the metal plate 16 and the piezoelectric element 18 together makes it possible to reduce the tensile stress acting on the piezoelectric element 18 upon a load being applied to the piezoelectric element 18, making it possible to prevent the piezoelectric element 18 from breaking or the like. Note that the metal plate 16 is not a required constituent element. The power generating apparatus 100 need not include the metal plate 16 in cases where only a small load is applied to the piezoelectric element 18 and there is no worry of breakage or the like. Note that the piezoelectric element 18 is not limited to a PZT-based ceramic material. The piezoelectric element 18 may be configured of a piezoelectric material of a non-leaded piezoelectric ceramic material such as a potassium sodium niobate-based ceramic material or an alkali niobate-based ceramic material, for example.

(Lever Mechanism 20)

The lever mechanism 20 includes a lever 21, support members 22 and 23, and a pivot shaft 24 (also called a "support point"). The lever 21 is substantially plate-shaped and is formed of a resin, for example. The lever 21 has a front surface 21S, a rear surface 21T, a tip portion 21A, a base portion 21B, and a through-hole 21H. The through-hole 21H is a part for inserting the pivot shaft 24, and is provided near the base portion 21B.

The support members 22 and 23 have support portions 22A and 23A and anchoring portions 22B and 23B, respectively. The support portions 22A and 23A support the pivot shaft 24. The anchoring portions 22B and 23B are positioned between the support portions 22A and 23A and the base 10. The lever 21 is supported by the support members 22 and 23 and the pivot shaft 24 so as to be capable of pivoting (that is, pivotally supported) around the pivot shaft 24. The rear surface 21T of the lever 21 faces a front surface of the piezoelectric element 18.

According to the exemplary embodiment, the support portions 22A and 23A are parallel to each other, and respectively extend from the sides on which the anchoring portions 22B and 23B are located toward the side on which the piezoelectric element 18 is located. When the power generating apparatus 100 is viewed in plan view (see FIG. 2), portions of the support portions 22A and 23A located on sides where leading end portions 22C and 23C, respectively, are located, face the piezoelectric element 18. The support portions 22A and 23A support the pivot shaft 24 near the leading end portions 22C and 23C, respectively. The pivot shaft 24 is disposed in a location where, when the pivot shaft 24 is projected in a direction orthogonal to the front surface of the piezoelectric element 18, a projected image of the pivot shaft 24 overlaps with the front surface of the piezoelectric element 18 (see FIGS. 2 and 3).

A projecting portion 26 (also called an "action point" or "projection") is provided on the rear surface 21T of the lever 21. The projecting portion 26 projects from the flat rear surface 21T toward the side where the piezoelectric element 18 is located. The projecting portion 26 functions as an action point of the lever mechanism 20, and is provided so as to face the front surface of the piezoelectric element 18. According to the exemplary embodiment, the projecting portion 26 contacts the piezoelectric element 18 while the lever mechanism 20 is not pressed (that is, is in an unloaded state). However, the projecting portion 26 need not absolutely be in contact with the piezoelectric element 18 in the unloaded state according to alternative embodiments.

According to the lever mechanism 20 configured as described thus far, pressing the lever 21 causes the lever 21 to pivot central to (or about) the pivot shaft 24 (the support point) in a direction that brings the projecting portion 26 (the action point) toward the piezoelectric element 18. The load applied to the lever mechanism 20 increases in accordance with a leverage ratio among a force point corresponding to the part where the load is applied, the projecting portion 26 (the action point), and the pivot shaft 24 (the support point).

Referring to FIG. 2, a portion of the lever mechanism 20 that acts as a force point thereof can be provided at any desired location on the front surface 21S of the lever 21 as long as that location can make use of the principle of leverage. The portion that functions as the force point is, in the case where a button is provided on the housing that houses the power generating apparatus 100, a part of the front surface 21S of the lever 21 that receives the load (a pressure force) from the button.

From the standpoint of using the leverage ratio, it is preferable that the portion that functions as the force point be provided within a region 25, indicated in FIG. 2 by a dot-dash line, of the front surface 21S of the lever 21. The region 25 indicates a part of the front surface 21S of the lever 21 located closer to the tip portion 21A (a free end) than the projecting portion 26 (the action point). In the present embodiment, the force point of the lever mechanism 20 is provided in a position corresponding to the magnet 31, described next. Specifically, a force point 25F of the lever mechanism 20 is provided in a position, on the front surface 21S of the lever 21, opposite from the magnet 31 provided on the rear surface 21T of the lever 21.

The magnet 31 is formed from a permanent magnet such as neodymium, and is provided on the rear surface 21T of the lever 21. According to an exemplary embodiment, the magnet 31 is located in the exact center, in the shortwise direction of the lever 21, of the rear surface 21T of the lever 21. The magnet 31 is located near the tip portion 21A, in the lengthwise direction of the lever 21, of the rear surface 21T of the lever 21. When the force point 25F is pressed, the magnet 31 pivots central to the pivot shaft 24 integrally with the lever 21.

The magnet 32 is formed from a permanent magnet such as a neodymium magnet or a ferrite magnet, and is provided upon the base 10. The magnet 32 is disposed in a position facing the magnet 31 so as to have magnetic characteristics of being attracted to the magnet 31. For example, the magnet 31 is disposed so that its S pole faces toward the magnet 32 side, and the magnet 32 is disposed so that its N pole faces toward the magnet 31 side. The relationship of these magnetic poles may be reversed, however.

One of the magnets 31 and 32 may be formed from a magnetic body such as iron, cobalt, nickel, or an alloy thereof, ferrite, or the like. For example, the lever 21 may be formed from a magnetic body such as iron, and the lever 21 may have characteristics of mutual attraction with the magnet 32. In this case, the magnet 31 is not a required constituent element, and the lever 21 functions as the first magnetic body. The lever 21 itself may be formed from a permanent magnet. In this case as well, the magnet 31 is not a required constituent element, and a part of the lever 21 that is attracted to the magnet 32 functions as the first magnetic body.

The base 10 may be formed from a magnetic body such as iron, and the base 10 may have characteristics of mutual attraction with the magnet 31. In this case, the magnet 32 is not a required constituent element, and a part of the base 10 that is attracted to the magnet 31 functions as the second magnetic body. Part or all of the base 10 may be formed from a permanent magnet. In this case as well, the magnet 32 is not a required constituent element, and a part of the base 10 that is formed from the permanent magnet (that is, a part that is attracted to the magnet 31) functions as the second magnetic body.

Figure 5:
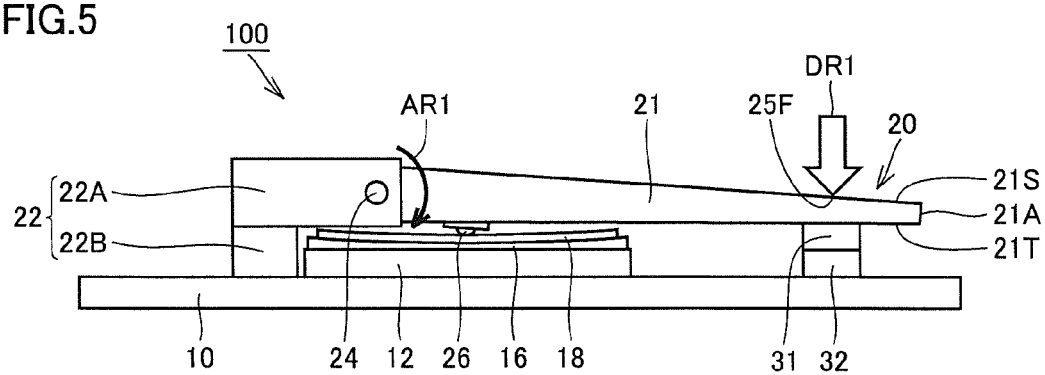
FIG. 5 is a diagram illustrating a lever mechanism of the power generating apparatus according to the first embodiment being pressed and the lever mechanism pivoting in a direction toward a second magnetic body.

As illustrated in FIG. 5, the power generating apparatus 100 is provided in a push-button switch, for example. Upon the button being pressed, a load resulting from that press acts on the force point 25F of the lever mechanism 20 (arrow DR1). The load acting on the force point 25F causes the lever 21 to pivot central to the pivot shaft 24 so that the projecting portion 26 approaches the piezoelectric element 18 (arrow AR1). The load is amplified in accordance with the leverage ratio due to the principle of leverage, and the load is applied to the piezoelectric element 18 by the projecting portion 26 (the action point).

Figure 6:
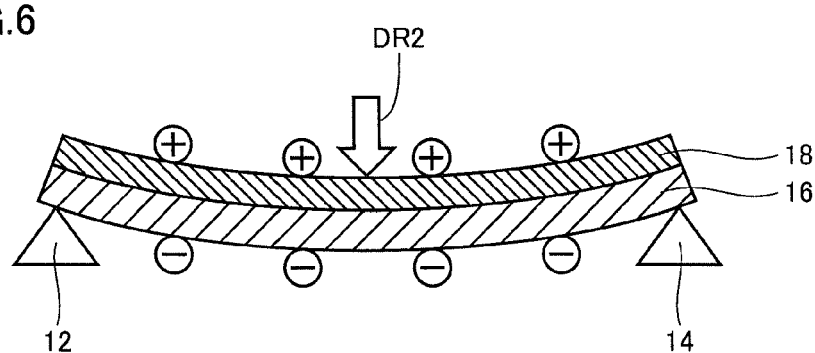
FIG. 6 is a diagram schematically illustrating the piezoelectric element of the power generating apparatus according to the first embodiment deforming and generating power.

As illustrated in FIG. 6, the piezoelectric element 18 that has received the load (arrow DR2) from the projecting portion 26 (FIG. 5) elastically deforms (bends) integrally with the metal plate 16. When the load is applied to the piezoelectric element 18, the magnet 31 (FIG. 5) approaches the magnet 32 (FIG. 5) while being attracted to the magnet 32. An attractive force (magnetic coupling force) arising between the magnets 31 and 32 acts when the lever 21 pivots. The attractive force assists the pressing action of a user who has pressed the push-button switch, for example.

As discussed above, Japanese Unexamined Patent Application Publication No. 2003-111445 (Patent Document 1) discloses a power generating apparatus including a piezoelectric element and a lever mechanism. In this power generating apparatus, a spring is disposed between a striking piece and a base; however, the spring is provided for regulating an uppermost position of the striking piece, and has almost no assistive function. Although reducing the spring constant of the piezoelectric element can be considered as a way to lighten the burden involved in the user's pressing action, doing so reduces the amount of power generated.

In contrast, according to the power generating apparatus 100 of the present embodiment, the power generating apparatus 100 can deform the piezoelectric element 18 efficiently through the attractive force (assistive force) between the magnets 31 and 32 in addition to the lever mechanism 20. Employing the lever mechanism 20 and the magnets 31 and 32 makes it possible for the user to generate the same amount of power as in the past, but with a smaller force than in the past. The user can also generate a greater amount of power than in the past using the same (or less) force than in the past.

The attractive force between the magnets 31 and 32 can also accelerate the pivot speed of the lever 21. In other words, the lever 21 can pivot faster than in the case where the magnets 31 and 32 are not used, which makes it possible to increase the amount of deformation in the piezoelectric element 18 per unit of time. Through this, charges generated by the piezoelectric element 18 are suppressed from leaking, which makes it possible to increase the power generation efficiency. "Power generation efficiency" refers to the ratio of the amount of power generated (output energy) to the pressing action (input energy).

A voltage generated by the piezoelectric element 18 deforming causes a light indicating that the button has been pressed to light, is supplied to a device that wirelessly sends a signal indicating that the button has been pressed, or the like, for example. The power generating apparatus 100 is not limited to being pressed by a user, and may generate power in response to being pressed by a mechanical means such as a gear, a hammer, or the like. An effect of reducing the burden on the mechanical means is achieved in this case as well.

Referring again to FIG. 3, the magnet 31 is positioned near the tip portion 21A on the rear surface 21T of the lever 21, and the magnet 32 is disposed in a position facing the magnet 31, as described above. A distance L1 between the pivot shaft 24 and the magnet 31 is greater than a distance L2 between the pivot shaft 24 and the projecting portion 26. According to this configuration, the attractive force produced between the magnets 31 and 32 is also amplified based on the principle of leverage, making it possible to more efficiently deform the piezoelectric element 18.

A relationship between the displacement amount of the force point 25F of the lever mechanism 20 and the load required to displace the force point 25F of the lever mechanism 20 will be described with reference to FIGS. 7 and 8. Upon the force point 25F being pressed and the piezoelectric element 18 elastically deforming, a force that attempts to return the piezoelectric element 18 to its original state (a restorative force) arises in the piezoelectric element 18 (arrow DR3 in FIG. 7). It is necessary to apply a load greater than this restorative force to the piezoelectric element 18 in order to deform the piezoelectric element 18 further.

Figure 7:
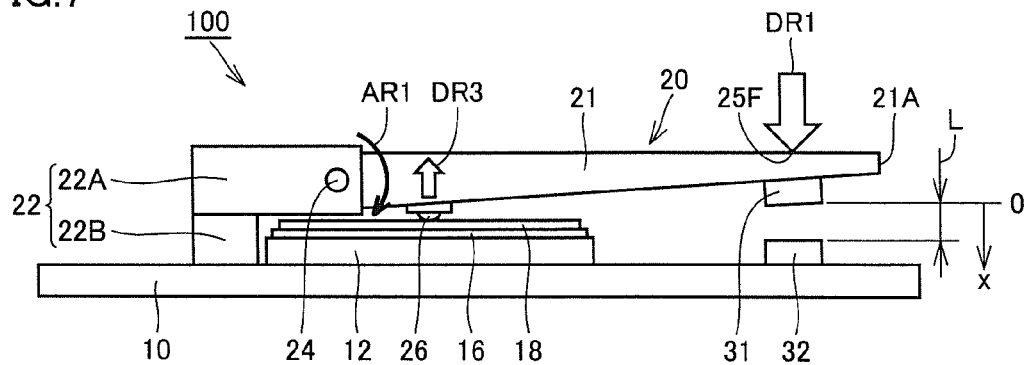
FIG. 7 is a diagram illustrating a relationship between a displacement amount of a force point of the lever mechanism and a load required to displace the force point of the lever mechanism, in the power generating apparatus according to the first embodiment.
Figure 8:
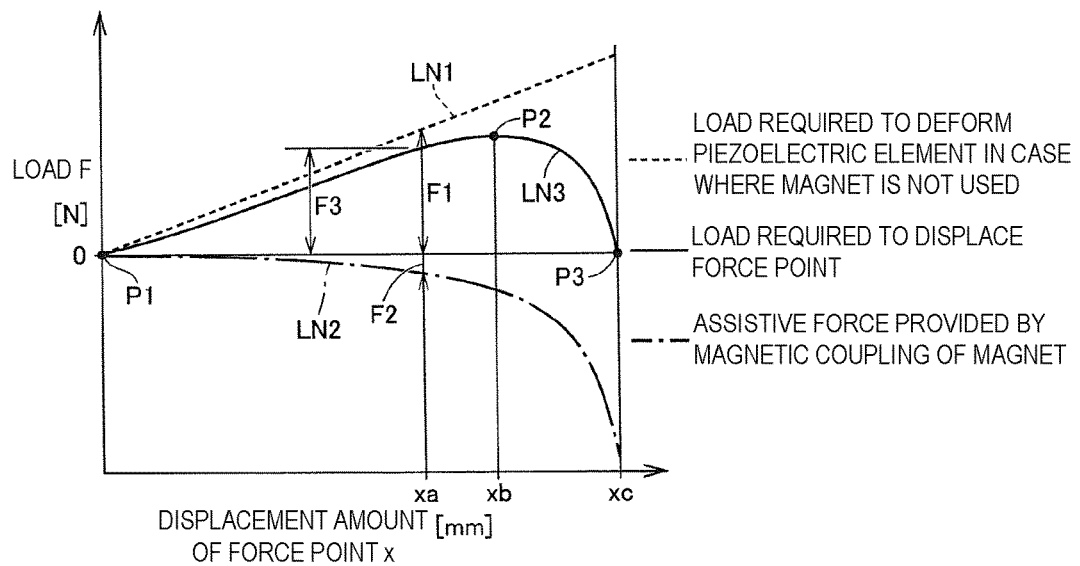
FIG. 8 is a graph illustrating a relationship between a displacement amount of a force point of the lever mechanism and a load required to displace the force point of the lever mechanism, in the power generating apparatus according to the first embodiment.

Referring to FIGS. 7 and 8, the displacement amount of the force point 25F when the force point 25F is pressed is represented by x (mm) (the horizontal axis in FIG. 8). The displacement amount x of the force point 25F is substantially the same as the displacement amount of the magnet 31. When the piezoelectric element 18 deforms, the deformation amount of the piezoelectric element 18 and the load required to deform the piezoelectric element 18 are in a linear relationship. Assuming, for example, that the magnets 31 and 32 are not being used, the displacement amount x of the force point 25F (see FIG. 7) and the load (F1) required to deform the piezoelectric element 18 are in a relationship expressed by a line LN1 in FIG. 8. This relationship is expressed by the following Formula 1.

$$F1(x) = k'x \quad \text{(Formula 1)}$$

The spring constant is represented by k' in Formula 1 based on the fact that the lever mechanism 20 is being used, and in the case where the leverage ratio is 3, for example, k'=1/3k (k where k is the actual spring constant of the piezoelectric element 18).

On the other hand, the assistive force (F2) produced by the magnetic coupling between the magnets 31 and 32 is in a relationship expressed by line a LN2 in FIG. 8. Based on Coulomb's law, the magnetic coupling force F2(x) arising between the opposing magnets 31 and 32 is expressed by the following Formula 2.

$$F2(x) = [1/(4\pi\mu_0)] \times [(m_1 \times m_2)/(L-x)^2] \quad \text{(Formula 2)}$$

In this formula, L represents the distance between the magnets 31 and 32 in an initial (unloaded) state (see FIG. 7). $\mu_0$ represents the permeability of the vacuum magnetic constant. $m_1$ represents the magnetic pole of the magnet 31, and $m_2$ represents the magnetic pole of the magnet 32. The positive/negative signs of the magnetic pole inland the magnetic pole $m_2$ are opposite from each other.

The load F3(x) applied to the piezoelectric element 18 that is required to deform the piezoelectric element 18 is expressed as F3(x)=F1(x)+F2(x) (where F1(x)>0, F2(x)<0), and is in the relationship expressed by a line LN3 in FIG. 8. For example, a load of F3(xa) (where F3(xa)<F1(xa)) is sufficient to displace the force point 25F by a distance xa.

In the unloaded state (x=0), the magnets 31 and 32 are distanced from each other and thus almost no magnetic coupling force arises, but the pressing action causes the magnets 31 and 32 to approach each other. The magnetic coupling force gradually increases and assists the pressing action. Although the restorative force of the piezoelectric element 18 (the arrow DR3 in FIG. 7) also increases with the amount by which the piezoelectric element 18 is pressed, the magnets 31 and 32 provide the assistive force.

Accordingly, compared to a power generating apparatus that does not include the magnets 31 and 32 (a comparative example), the power generating apparatus 100 according to the present embodiment can generate the same amount of power as the comparative example with a lower load than the comparative example. The present embodiment can also generate a greater amount of power than the comparative example with the same load as the comparative example. Thus the power generating apparatus 100 can achieve a high power generation efficiency.

In the present embodiment, the load F3(x) applied to the piezoelectric element 18 that is required to deform the piezoelectric element 18 gradually increases in a range from a point P1 to a point P2 in FIG. 8, and then gradually decreases in a range from the point P2 to a point P3. The load required to displace the force point 25F also gradually increases in the range from the point P1 to the point P2 and gradually decreases in the range from the point P2 to the point P3.

The point P2 represents a load required to displace the force point 25F by a displacement amount xb. While the force point 25F is being displaced from an initial position to a displacement amount xc (a maximum stroke amount), the load gradually increases until the displacement amount xb is reached; the load reaches an extreme value at the displacement amount xb, and then decreases thereafter until the displacement amount xc is reached.

In the power generating apparatus 100, the magnetic poles $m_1$ and $m_2$ of the magnets 31 and 32, the spring constant k of the piezoelectric element 18, and so on, as well as the leverage ratio of the lever mechanism 20 are configured for realizing these increases and decreases. Meanwhile, the displacement amount at the point P2 in FIG. 8, which is xb, is the same as x when the following Formula 3 holds true.

$$dF1(x)/dx = -dF2(x)/dx \quad \text{(Formula 3)}$$

In other words, when the force point 25F is displaced by the displacement amount xb, an amount by which the load F1 required to deform the piezoelectric element 18 (see Formula 1) momentarily increases and an amount by which the magnetic coupling force F2 produced between the magnets 31 and 32 (see Formula 2) momentarily increases have the same absolute values. As a result, the load F3 required to displace the force point 25F reaches an extreme value at the point in time when the force point 25F has been displaced by the displacement amount xb.

The range from the point P1 to the point P3 corresponds to the pivoting range of the lever 21. The range from the point P1 to the point P2 corresponds to a first pivoting range of the lever 21, whereas the range from the point P2 to the point P3 corresponds to a second pivoting range of the lever 21. The first pivoting range is a range spanning until the force point 25F in the unloaded state reaches the displacement amount xb. The second pivoting range is a range spanning until the force point 25F positioned at the displacement amount xb reaches the displacement amount xc. The second pivoting range is located on a side farther than the first pivoting range in the direction that brings the projecting portion 26 (the action point) closer to the piezoelectric element 18.

The load required to displace the force point 25F increases throughout the first pivoting range and decreases throughout the second pivoting range. According to this configuration, the burden on the user goes from increasing to decreasing toward the end of the pressing action. The decrease in the burden causes the user to feel that the burden on his/her finger has dropped off. The user can thus feel a sense of accomplishment at completing the pressing action, and can feel a tangible sensation that the button or the like has been properly pressed, for example. As indicated by the point P3 in FIG. 8, once the force point 25F has been displaced by the displacement amount xc (the maximum stroke amount), the load required to displace the force point 25F further may be substantially zero.

In the present embodiment, the pivoting range of the lever 21 is set so that the magnet 31 makes contact with the magnet 32 upon the lever 21 being completely pivoted in the direction that brings the projecting portion 26 toward the piezoelectric element 18. In other words, the displacement amount xc in FIG. 8 is the same as a distance L between the magnets 31 and 32 in the unloaded state (see FIG. 7), and a stroke amount that enables the lever 21 to pivot by the displacement amount xc (=the distance L) is ensured.

Employing a configuration in which the magnets 31 and 32 make contact with each other at the same time as the lever 21 reaching the position where the pressing action ends makes it possible to make full use of the assistive force of the magnets 31 and 32. The sound and feeling of contact produced when the magnets 31 and 32 make contact with each other elicits in the user a sense that the pressing action has ended. The user can thus feel a sense of accomplishment at completing the pressing action, and can feel a strong, tangible sensation that the button or the like has been properly pressed, for example. Note that this configuration is not absolutely necessary, and the configuration may be such that the magnets 31 and 32 do not make contact with each other when the lever 21 reaches the position where the pressing action ends.

(First Variation)

A power generating apparatus 101 according to a first variation will be described with reference to FIGS. 9 to 11. In the present variation, the load $F3(x)$ applied to the piezoelectric element 18 (FIG. 10) that is required to deform the piezoelectric element 18 is in the relationship expressed by the line LN3 in FIG. 9. The magnetic coupling force between the magnets 31 and 32 used in the present variation is smaller than the magnetic coupling force between the magnets 31 and 32 used in the above-described embodiment.

Figure 9:
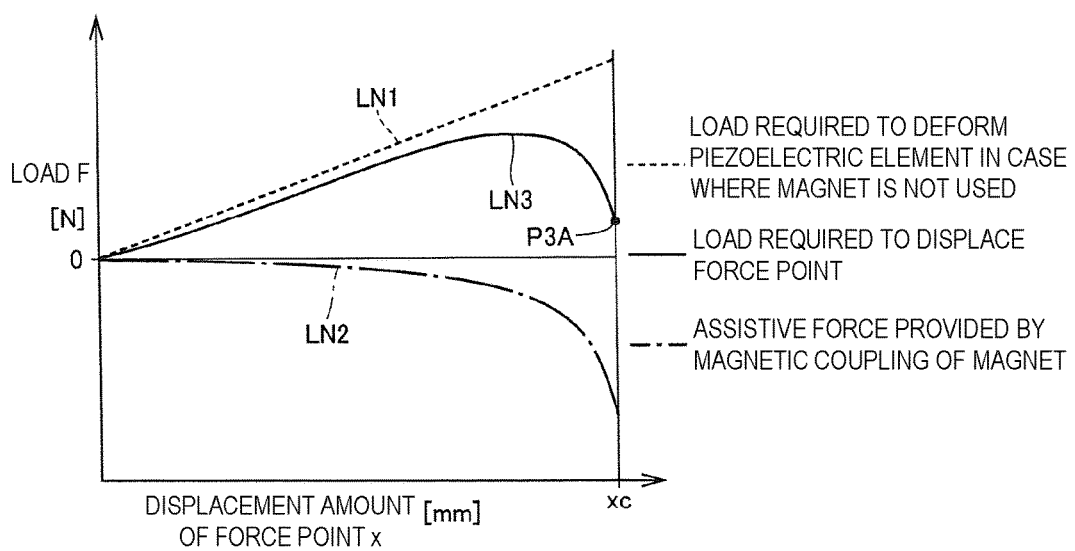
FIG. 9 is a graph illustrating a relationship between a displacement amount of a force point of a lever mechanism and a load required to displace the force point of the lever mechanism, in a power generating apparatus according to a first variation on the first embodiment.

As indicated by a point P3A in FIG. 9, once the force point 25F has been displaced by the displacement amount xc (the maximum stroke amount), the load required to displace the force point 25F further is a value greater than zero. To rephrase, at the point in time when the lever 21 is completely pivoted in the direction that brings the projecting portion 26 toward the piezoelectric element 18, an opposing force produced by the deformation of the piezoelectric element 18 acts on the lever 21, and that opposing force is stronger than the magnetic coupling force between the magnets 31 and 32.

Figure 10:
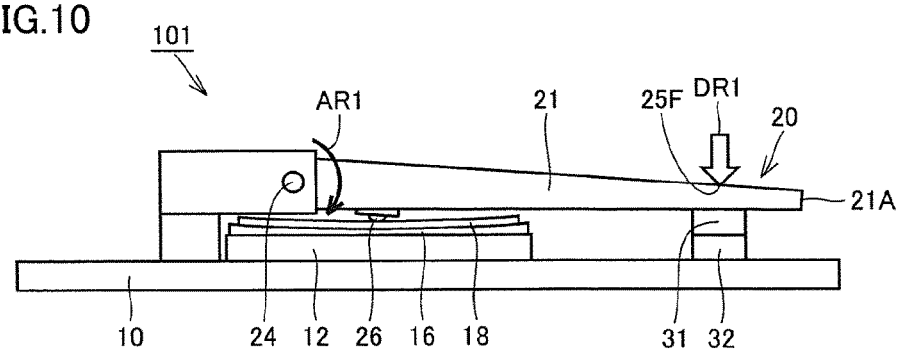
FIG. 10 is a diagram illustrating the lever mechanism of the power generating apparatus according to the first variation on the first embodiment being pressed and the lever mechanism pivoting in a direction toward a second magnetic body.
Figure 11:
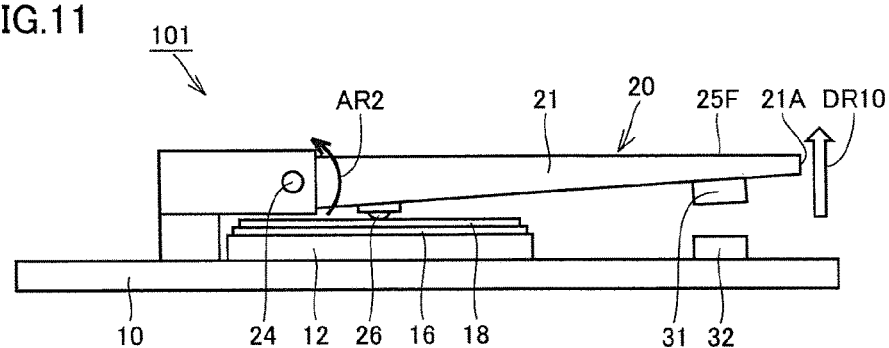
FIG. 11 is a diagram illustrating the lever mechanism of the power generating apparatus according to the first variation on the first embodiment pivoting in a direction away from the second magnetic body.

FIG. 10 illustrates the force point 25F being displaced from the initial position to the displacement amount xc (the maximum stroke amount). In this state, when the load applied to the lever mechanism 20 (the arrow DR1) is released, the lever 21 of the lever mechanism 20 pivots in the direction of an arrow AR2, as indicated in FIG. 11. The force point 25F also returns to its original position, as indicated by an arrow DR10. This configuration can be applied in, for example, an automatically-resetting push-button switch in which the contact point turns on only while the button is being pressed.

(Second Variation)

A power generating apparatus 102 according to a second variation will be described with reference to FIGS. 12 and 13. In the present variation, the load $F3(x)$ applied to the piezoelectric element 18 (FIG. 13) that is required to deform the piezoelectric element 18 is in the relationship expressed by the line LN3 in FIG. 12. The magnetic coupling force between the magnets 31 and 32 used in the present variation is greater than the magnetic coupling force between the magnets 31 and 32 used in the above-described embodiment.

Figure 12:
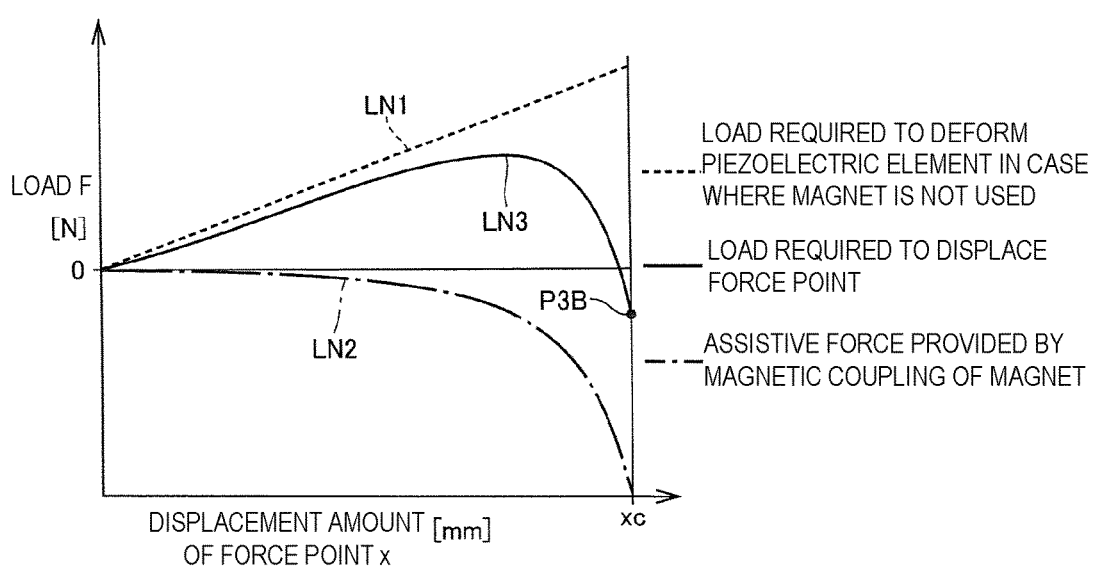
FIG. 12 is a graph illustrating a relationship between a displacement amount of a force point of a lever mechanism and a load required to displace the force point of the lever mechanism, in a power generating apparatus according to a second variation on the first embodiment.

As indicated by a point P3B in FIG. 12, once the force point 25F has been displaced by the displacement amount xc (the maximum stroke amount), the load required to displace the force point 25F further is a value less than zero. To rephrase, at the point in time when the lever 21 is completely pivoted in the direction that brings the projecting portion 26 toward the piezoelectric element 18, an opposing force produced by the deformation of the piezoelectric element 18 acts on the lever 21, and that opposing force is weaker than the magnetic coupling force between the magnets 31 and 32.

Figure 13:
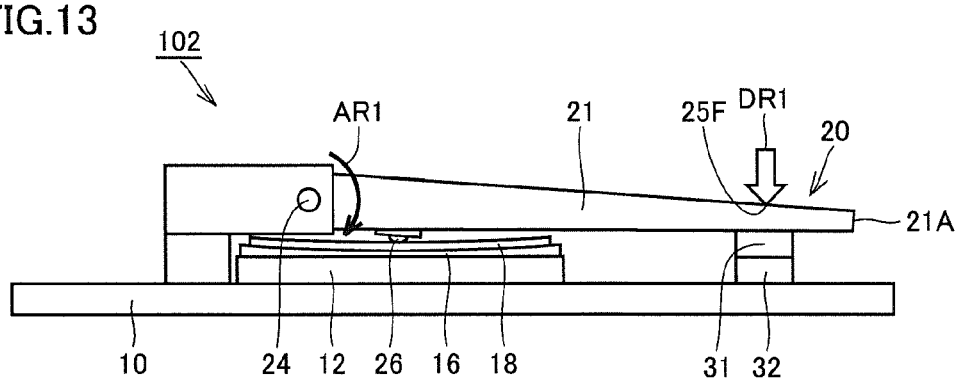
FIG. 13 is a side view illustrating the power generating apparatus according to the second variation on the first embodiment.

FIG. 13 illustrates the force point 25F being displaced from the initial position to the displacement amount xc (the maximum stroke amount). In this state, even if the load applied to the lever mechanism 20 (the arrow DR1) is released, the lever 21 of the lever mechanism 20 will not pivot, and the position of the force point 25F will not change. This situation can be realized both in the case where the magnets 31 and 32 are in contact with each other and the case where the magnets 31 and 32 are not in contact with each other, in accordance with the magnitude of the magnetic coupling force between the magnets 31 and 32.

Figure 14:
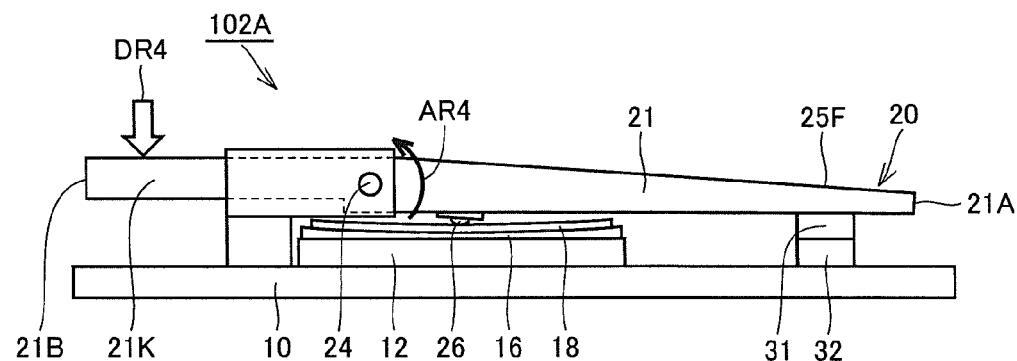
FIG. 14 is a side view illustrating another configuration of the power generating apparatus according to the second variation on the first embodiment.

As indicated by the power generating apparatus 102A illustrated in FIG. 14, it is preferable that the lever 21 include an extended portion 21K. The extended portion 21K is located on the side of the pivot shaft 24 opposite from the force point 25F. Pressing the extended portion 21K as indicated by an arrow DR4 causes the magnets 31 and 32 to separate and enables the lever 21 to return to the initial position with ease. This configuration can be applied in, for example, a see-saw type (also called a "rocker" type) push-button switch or the like.

(Third Variation)

Figure 15:
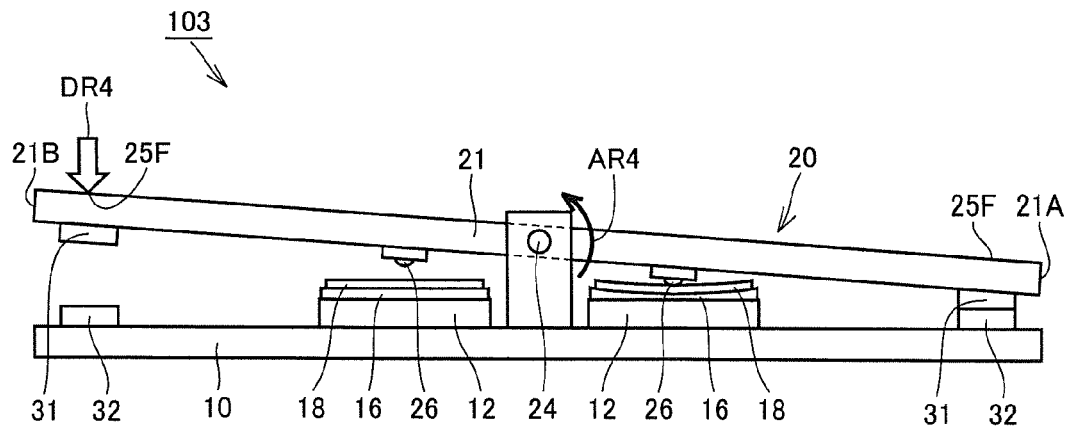
FIG. 15 is a side view illustrating a power generating apparatus according to a third variation on the first embodiment.

A power generating apparatus 103 according to a third variation will be described with reference to FIG. 15. In the present variation, too, the magnetic coupling force between the magnets 31 and 32 is greater than the magnetic coupling force between the magnets 31 and 32 used in the above-described embodiment. Another power generating mechanism is provided in a part corresponding to the extended portion 21K of the above-described power generating apparatus 102A (FIG. 14), and the power generating apparatus 103 is thus horizontally symmetrical central to the pivot shaft 24.

A load applied to cause the magnets 31 and 32 on the right side of the drawing to separate (the arrow DR4) is used by the piezoelectric element 18 on the left side of the drawing to generate power. This configuration too can be applied in, for example, a see-saw type (also called a "rocker" type) push-button switch or the like. Although a single piezoelectric element 18 is provided on the left and the right sides of the pivot shaft 24 in FIG. 15, these two piezoelectric elements 18 may be formed from a single piezoelectric element. In this case, the single piezoelectric element is long enough to face both of the two projecting portions 26.

(Fourth Variation)

Figure 16:
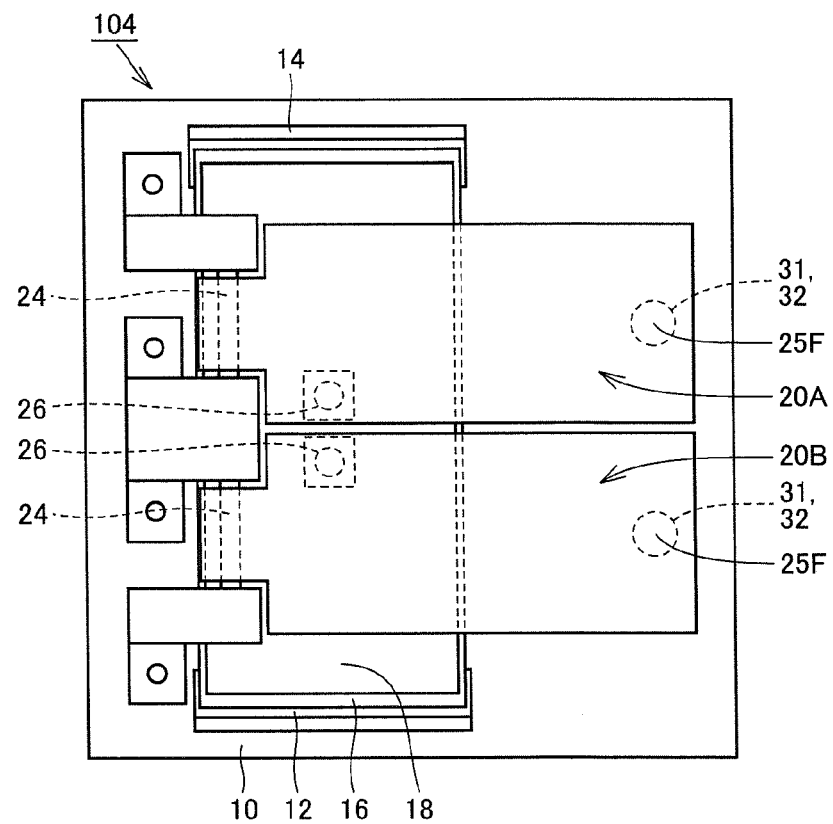
FIG. 16 is a plan view illustrating a power generating apparatus according to a fourth variation on the first embodiment.

A power generating apparatus 104 according to a fourth variation will be described with reference to FIG. 16. The power generating apparatus 104 according to the present variation includes a single piezoelectric element 18 and two lever mechanisms 20A and 20B that apply loads to the piezoelectric element 18. In the case where the lever mechanism 20A is pressed, a magnetic coupling force between the magnets 31 and 32 disposed on the side where the lever mechanism 20A is located is employed. In the case where the lever mechanism 20B is pressed, a magnetic coupling force between the magnets 31 and 32 disposed on the side where the lever mechanism 20B is located is employed. Such a configuration can be used in a push-button switch having two pressing parts or the like. Three or more sets of lever mechanisms 20 and magnets 31 and 32 can be applied to a single piezoelectric element 18 in accordance with the number of pressing parts of the push-button switch.

(Fifth Variation)

A power generating apparatus 105 according to a fifth variation will be described with reference to FIG. 17. In the above-described embodiment (see FIG. 3), the distance L1 between the pivot shaft 24 and the magnet 31 is greater than the distance L2 between the pivot shaft 24 and the projecting portion 26. This also applies to the above-described variations.

Figure 17:
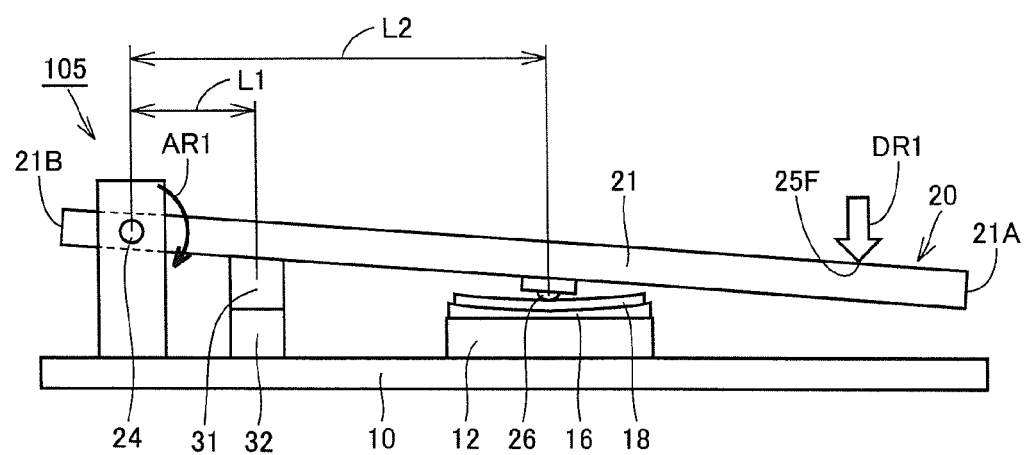
FIG. 17 is a side view illustrating a power generating apparatus according to a fifth variation on the first embodiment.

However, as illustrated in FIG. 17, the distance L1 between the pivot shaft 24 and the magnet 31 is shorter than the distance L2 between the pivot shaft 24 and the projecting portion 26 in the power generating apparatus 105. In the case of this configuration, the magnetic coupling force between the magnets 31 and 32 is no longer amplified (or is less easily amplified) due to the lever mechanism 20, and thus it is preferable to use stronger magnets for the magnets 31 and 32.

(Sixth Variation)

Figure 18:
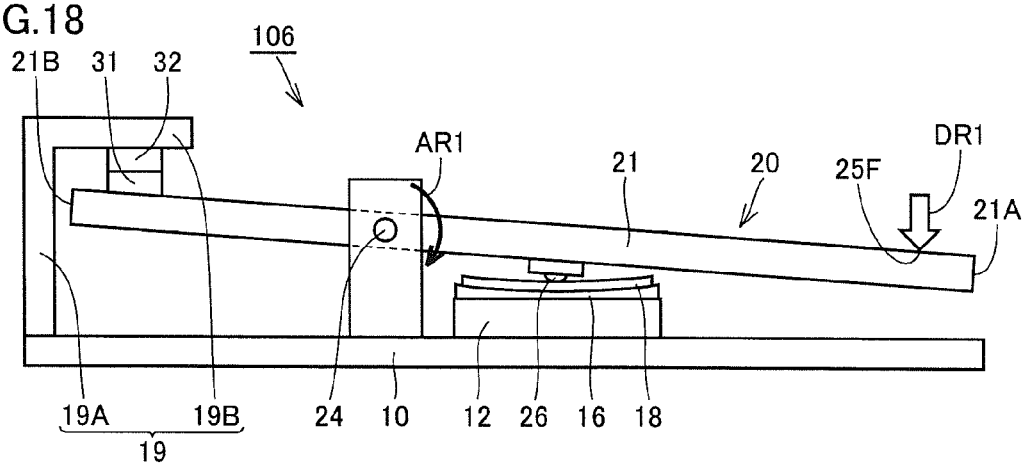
FIG. 18 is a side view illustrating a power generating apparatus according to a sixth variation on the first embodiment.

A power generating apparatus 106 according to a sixth variation will be described with reference to FIG. 18. In the power generating apparatus 106, the magnets 31 and 32 are located on the side of the pivot shaft 24 opposite from the force point 25F. The magnet 31 provided on the lever 21 moves in a direction away from the base 10 when the lever 21 is pivoted in a direction that brings the force point 25F closer to the base 10 (the arrow AR1).

The magnet 32 is provided on an L-shaped support body 19. To describe in more detail, the support body 19 includes a column portion 19A erected from the base 10 and a flange portion 19B provided on a leading end portion of the column portion 19A. The magnet 32 is attached to the flange portion 19B so as to face the magnet 31.

According to this configuration as well, an attractive force (magnetic coupling force) arising between the magnets 31 and 32 acts when the lever 21 pivots. It is preferable that the distance between the pivot shaft 24 and the magnet 31 be greater than the distance between the pivot shaft 24 and the projecting portion 26 in the configuration of the present variation as well. The attractive force produced between the magnets 31 and 32 is amplified based on the principle of leverage, making it possible to more efficiently deform the piezoelectric element 18.

(Seventh Variation)

Figure 19:
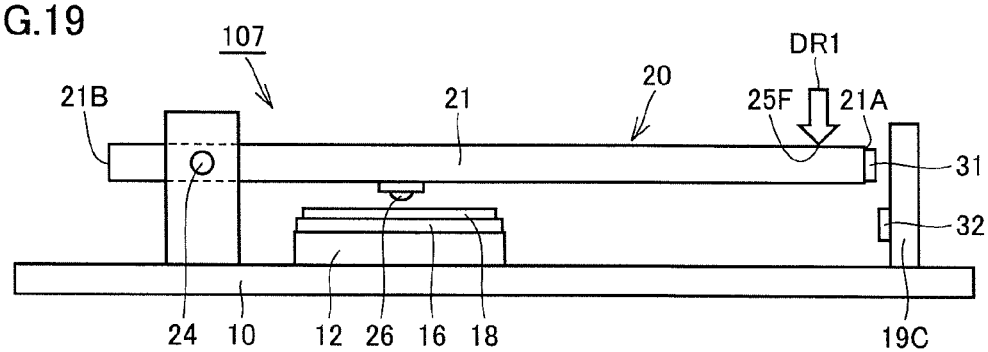
FIG. 19 is a side view illustrating a power generating apparatus according to a seventh variation on the first embodiment.

A power generating apparatus 107 according to a seventh variation will be described with reference to FIG. 19. In the above-described embodiment (see FIG. 3), the magnets 31 and 32 are disposed so as to face each other. However, the magnets 31 and 32 need not be disposed so as to face each other, as illustrated in FIG. 19. The magnet 31 is provided on the tip portion 21A of the lever 21, and the magnet 32 is provided on a column portion 19C erected from the base 10.

Figure 20:
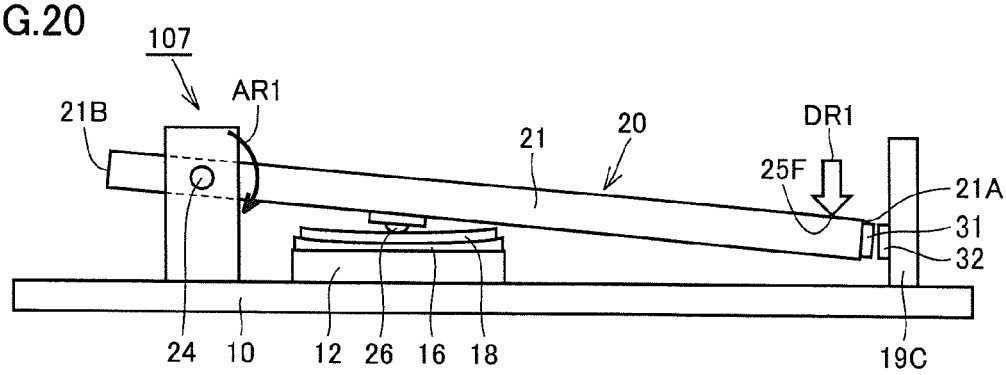
FIG. 20 is a diagram illustrating a lever mechanism of the power generating apparatus according to the seventh variation on the first embodiment being pressed and the lever mechanism pivoting in a direction toward a second magnetic body.

According to this configuration as well, the magnet 31 approaches the magnet 32 while being attracted thereto when the force point 25F is pressed (the arrow DR1), and an attractive force (magnetic coupling force) arising between the magnets 31 and 32 acts, as illustrated in FIG. 20. The power generating apparatus 107 is configured so that the magnets 31 and 32 face each other toward the end of the pivot operation of the lever 21 (near the completion of the pressing action). The configuration is not limited thereto, and may be such that the magnets 31 and 32 are not constantly facing each other as long as the magnet 31 can approach the magnet 32 while being attracted thereto.

(Other Variations)

The above-described embodiment and respective variations have described a configuration in which a load is applied to the center of the piezoelectric element 18 that is supported on both ends thereof, with the piezoelectric element 18 bending and deforming as a result. However, the configuration is not limited thereto, and the lever mechanism 20 and magnets 31 and 32 may be applied to a piezoelectric element 18 supported at one end in a cantilevered state. Even in this case, the lever mechanism 20 and the magnets 31 and 32 are used when bending and deforming the piezoelectric element 18. However, supporting the piezoelectric element 18 on both ends has an advantage in that the structure can be made simpler than in the case where the piezoelectric element 18 is supported on one end in a cantilevered state. The lever mechanism 20 and magnets 31 and 32 may be applied in a configuration in which the piezoelectric element 18 contracts and deforms in an axial direction. The same actions and effects as described above can be achieved in such a case as well.

Second Embodiment

Figure 21:
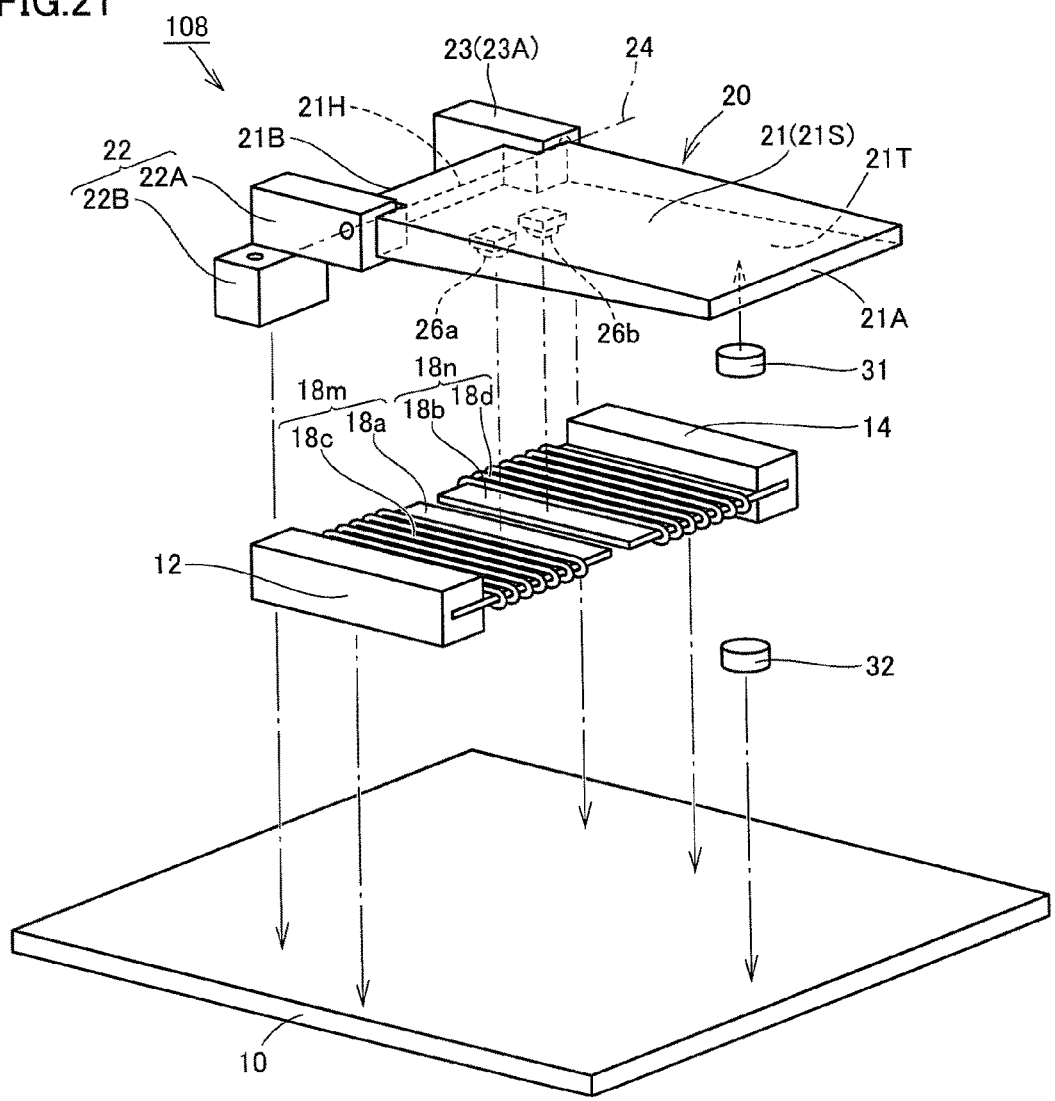
FIG. 21 is a perspective view illustrating a power generating apparatus according to a second embodiment in an exploded state.
Figure 22:
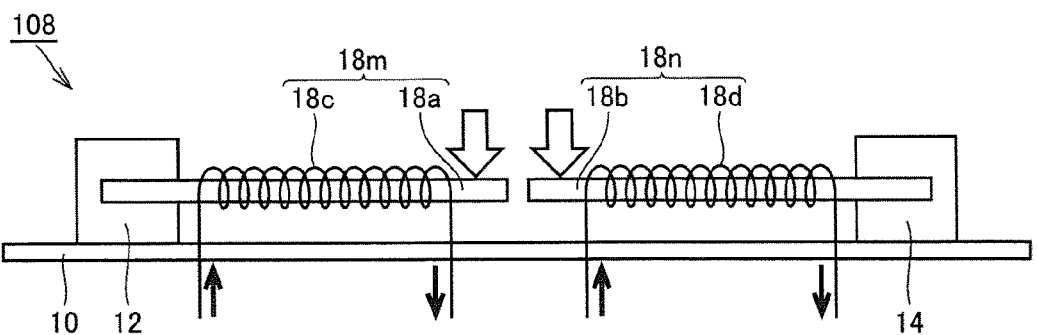
FIG. 22 is a diagram schematically illustrating a power generating element of the power generating apparatus according to the second embodiment generating power.

A power generating apparatus 108 according to a second embodiment will be described with reference to FIGS. 21 and 22. Primarily the differences between the second embodiment and the first embodiment will be described here. FIG. 21 is a perspective view illustrating the power generating apparatus 108 in an exploded state, and corresponds to FIG. 4 in the above-described first embodiment. FIG. 22 is a diagram schematically illustrating the power generating apparatus 108 generating power. For the sake of simplicity, the lever mechanism 20 and magnets 31 and 32 are not illustrated in FIG. 22.

The power generating apparatus 108 according to the present embodiment and the above-described first embodiment differ in that power generating elements 18*m* and 18*n* serving as a power generating portion are magnetostrictors around which coils are wrapped; the rest of the configuration is substantially the same. In the present embodiment, two magnetostrictors 18*a* and 18*b* around which coils are wrapped are used as the power generating elements 18*m* and 18*n*. Only one of these may be used as well. The power generating element 18*m* is constituted of the magnetostrictor 18*a* and a coil 18*c*, and the power generating element 18*n* is constituted of the magnetostrictor 18*b* and a coil 18*d*.

The magnetostrictors 18*a* and 18*b* are formed from terbium, dysprosium, iron, or the like, for example. The magnetostrictors 18*a* and 18*b* have thin rod shapes or thin plate shapes, for example, and are supported in cantilevered states by the anchoring members 12 and 14, respectively. The single power generating element 18*m* is constituted of the magnetostrictor 18*a* and the coil 18*c* wrapped around the magnetostrictor 18*a*. The single power generating element 18*n* is constituted of the magnetostrictor 18*b* and the coil 18*d* wrapped around the magnetostrictor 18*b*.

Projecting portions 26*a* and 26*b* (action points) provided on the rear surface 21T of the lever 21 face the vicinity of free ends of the magnetostrictors 18*a* and 18*b*, respectively. The white arrows in FIG. 22 indicate the magnetostrictors 18*a* and 18*b* receiving a load through the lever 21 (the projecting portions 26*a* and 26*b*) of the lever mechanism 20 (FIG. 21). When a load is applied to the magnetostrictors 18*a* and 18*b* and the magnetostrictors 18*a* and 18*b* deform, lines of magnetic force fluctuate in the periphery of the magnetostrictors 18*a* and 18*b* due to a reverse magnetostrictive effect. At this time, an electromotive force is produced in the coils 18*c* and 18*d* due to the law of electromagnetic induction. Thus the power generating elements 18*m* and 18*n* serve as power generating elements and generate power.

According to this configuration as well, an attractive force (magnetic coupling force) arising between the magnets 31 and 32 (FIG. 21) acts when the lever 21 pivots. Like the case described with reference to FIG. 3, it is preferable that a distance between the pivot shaft 24 and the magnet 31 (see L1 in FIG. 3) be greater than a distance between the pivot shaft 24 and the projecting portions 26*a* and 26*b* (see L2 in FIG. 3) in the configuration according to the present embodiment. The attractive force produced between the magnets 31 and 32 is amplified based on the principle of leverage, making it possible to more efficiently deform the magnetostrictors 18*a* and 18*b* of the power generating elements 18*m* and 18*n*. The concept of using a magnetostrictor as a power generating element can also be applied in the case where the magnetostrictor is supported at both ends. Although the power generating element is a magnetostrictor around which a coil is wrapped in the above-described second embodiment, the embodiment is not limited thereto. For example, an element like a coil may be formed on the outside of the magnetostrictor using an electrode pattern, and the resulting element may be used as a power generating element.

Third Embodiment

Figure 23:
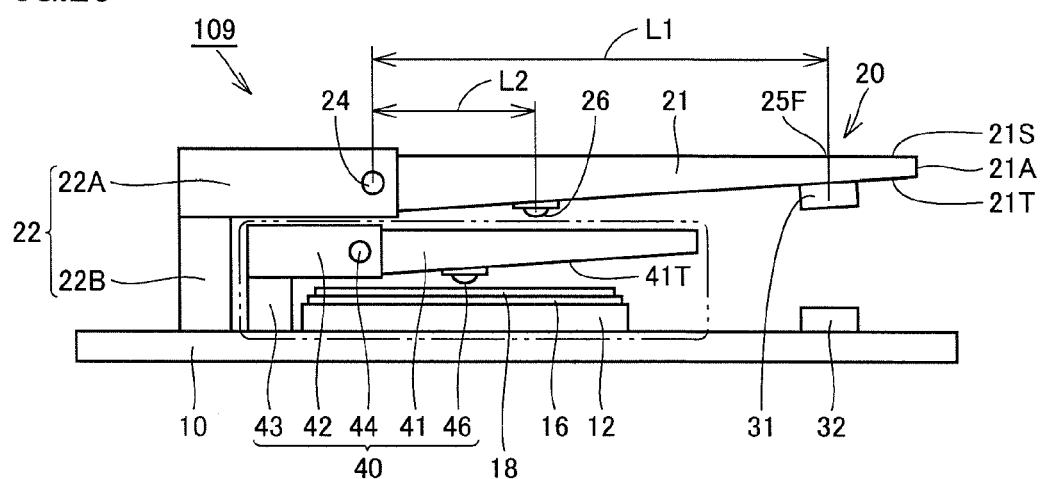
FIG. 23 is a side view illustrating a power generating apparatus according to a third embodiment.

A power generating apparatus 109 according to a third embodiment will be described with reference to FIG. 23. Primarily the differences between the third embodiment and the first embodiment will be described here. FIG. 23 is a side view illustrating the power generating apparatus 109, and corresponds to FIG. 3 in the above-described first embodiment.

The power generating apparatus 109 according to the present embodiment differs from the above-described first embodiment in that the power generating apparatus 109 further includes the piezoelectric element 18 and a lever mechanism 40 as a power generating portion; the rest of the configuration is substantially the same. The power generating portion according to the present embodiment has a module structure as indicated by the portion surrounded by the double-dot-dash line in FIG. 23.

To describe in more detail, the lever mechanism 40 that forms part of the power generating portion includes a lever 41, support members 42 and 43, and a pivot shaft 44 (also called a "support point"); a projecting portion 46 (also called an "action point") is provided on a surface 41T, of the lever 41, that faces the piezoelectric element 18. The projecting portion 46 is provided in a position between the lever mechanism 20 (the lever 21) and the piezoelectric element 18, and can function as a pressing portion that directly presses the piezoelectric element 18.

In the power generating apparatus 109, the lever 21 of the lever mechanism 20 pivots upon a load being applied to the lever 21. The lever 41 of the lever mechanism 40 then pivots upon the projecting portion 26 applying a load to the lever 41. The projecting portion 46 presses the piezoelectric element 18. The load applied to the lever mechanism 20 is thus applied to the piezoelectric element 18 through the projecting portion 46, which serves as a pressing portion.

According to this configuration as well, an attractive force (magnetic coupling force) arising between the magnets 31 and 32 acts when the lever 21 pivots. Like the case described with reference to FIG. 3, it is preferable that the distance L1 between the pivot shaft 24 and the magnet 31 be greater than the distance L2 between the pivot shaft 24 and the projecting portion 26 in the configuration according to the present embodiment. The attractive force produced between the magnets 31 and 32 is amplified based on the principle of leverage, making it possible to more efficiently deform the piezoelectric element 18.

The same dimensional relationship, positional relationship, and so on as the distances L1 and L2 can be applied in the relationship between the lever mechanism 40 and the piezoelectric element 18 as well. The dimensional relationships, positional relationships, and so on of the lever mechanisms 20 and 40 and the piezoelectric element 18 are optimized so that the load applied to the lever mechanism 20 is efficiently transmitted to the piezoelectric element 18 through the lever mechanism 40. The power generating apparatus 109 can generate power more efficiently when a proper leverage ratio is established between the lever mechanisms 20 and 40 and the piezoelectric element 18.

Although the projecting portion 46 serving as the pressing portion constitutes part of the lever mechanism 40 in the present embodiment, the embodiment is not limited thereto. Any member or portion may serve as the pressing portion as long as that member or portion is provided in a position between the lever mechanism 20 and the piezoelectric element 18 and is configured to be capable of directly pressing the piezoelectric element 18 when a load is applied to the lever mechanism 20.

Although several embodiments and variations based on the present invention have been described, the content disclosed herein is to be understood in all ways as exemplary and in no ways limiting. The technical scope of the present invention is defined by the scope of the claims, and all changes that fall within the same essential spirit as the scope of the claims are intended to be included therein as well.

REFERENCE SIGNS LIST

10 BASE
12, 14 ANCHORING MEMBER
16 METAL PLATE
18 PIEZOELECTRIC ELEMENT (POWER GENERATING PORTION, POWER GENERATING ELEMENT)
18a, 18b MAGNETOSTRICTOR
18c, 18d COIL
18m, 18n POWER GENERATING ELEMENT (POWER GENERATING PORTION)
19 SUPPORT BODY
19A, 19C COLUMN PORTION
19B FLANGE PORTION
20, 20A, 20B, 40 LEVER MECHANISM
21, 41 LEVER
21A TIP PORTION
21B BASE PORTION
21H THROUGH-HOLE
21K EXTENDED PORTION
21S FRONT SURFACE
21T REAR SURFACE
22, 23, 42, 43 SUPPORT MEMBER
22A, 23A SUPPORT PORTION
22B, 23B ANCHORING PORTION
22C, 23C LEADING END PORTION
24, 44 PIVOT SHAFT (SUPPORT POINT)
25 REGION
25F FORCE POINT
26, 26a, 26b PROJECTING PORTION (ACTION POINT)
31 MAGNET (FIRST MAGNETIC BODY)
32 MAGNET (SECOND MAGNETIC BODY)
41T SURFACE
46 PROJECTING PORTION (PRESSING PORTION)
100, 101, 102, 102A, 103, 104, 105, 106, 107, 108, 109 POWER GENERATING APPARATUS

The invention claimed is:

1. A power generating apparatus comprising:
a power generating element that generates power when a load is applied thereto;
a lever mechanism that includes a support point and a projection that faces the power generating element, wherein the lever mechanism pivots about the support point when the lever mechanism is pressed towards the power generating element;
a first magnetic body disposed on the lever mechanism that pivots integrally with the lever mechanism about the support point; and
a second magnetic body disposed on the power generating apparatus to face the first magnetic body and having magnetic characteristics to attract the first magnetic body,
wherein, when the lever mechanism is pressed towards the power generating element, the projection applies the load to the power generating element such that the power generating element generates the power.

2. The power generating apparatus according to claim 1, wherein, when the lever mechanism is pressed towards the power generating element, the first magnetic body approaches the second magnetic body while being attracted to the second magnetic body.

3. The power generating apparatus according to claim 2, wherein the first magnetic body contacts the second magnetic body when the lever mechanism finishes pivoting about the support point.

4. The power generating apparatus according to claim 1, wherein the power generating element includes a piezoelectric element.

5. The power generating apparatus according to claim 1, wherein the power generating element includes a magnetostrictor.

6. The power generating apparatus according to claim 5, wherein the power generating element further includes a coil wound around the magnetostrictor and a portion of the power generating element not wound by the coil faces the projection of the lever mechanism.

7. The power generating apparatus according to claim 1, wherein a distance between the support point and the first magnetic body is greater than a distance between the support point and the projection.

8. The power generating apparatus according to claim 1, wherein an opposing force produced by deformation of the power generating element acts on the projection of the lever mechanism when the lever mechanism finishes pivoting about the support point toward the power generating element.

9. The power generating apparatus according to claim 8, wherein the opposing force is weaker than a magnetic coupling force between the first magnetic body and the second magnetic body.

10. The power generating apparatus according to claim 1, wherein a pivoting range of the lever mechanism includes a first pivoting range and a second pivoting range located on a side farther than the first pivoting range in the direction that brings the projection toward the power generating element.

11. The power generating apparatus according to claim 10, wherein a force required to displace the lever mechanism increases in the first pivoting range and decreases in the second pivoting range.

12. The power generating apparatus according to claim 1, further comprising
a projecting portion disposed between the lever mechanism and the power generating element and including a pressing portion that directly presses the power generating element when the lever mechanism is pressed towards the power generating element.

13. The power generating apparatus according to claim 1, wherein the lever mechanism includes a magnetic material that forms the first magnetic body.

14. A power generating apparatus comprising:
a power generating element that generates power when a load is applied thereto;
a base with the power generating element attached to the base by at least one anchoring member;

a power generating element that generates power when a load is applied thereto;

a lever mechanism that includes a support point and a projection that faces the power generating element, wherein the lever mechanism pivots about the support point when the lever mechanism is pressed towards the power generating element;

a first magnetic body disposed on the lever mechanism that pivots integrally with the lever mechanism about the support point; and a second magnetic body disposed on the power generating apparatus to face the first magnetic body and having magnetic characteristics to attract the first magnetic body, wherein the support point of the lever mechanism is secured to the base by a support member and extends over the power generating element, and wherein, when the lever mechanism is pressed towards the power generating element, the projection applies the load to the power generating element such that the power generating element generates the power.

15. The power generating apparatus according to claim 14, wherein the second magnetic body is disposed on the base and faces the first magnetic body.

16. The power generating apparatus according to claim 14, wherein the second magnetic body is disposed on a column structure extending from a surface of the base and the first magnetic body is disposed on a tip of the lever mechanism to face the second magnetic body.

17. The power generating apparatus according to claim 14, further comprising:

an additional lever mechanism extending in a direction opposite the lever mechanism to form a see-saw configuration about the support member; and an additional power generating element disposed on the base facing the additional lever mechanism, wherein the additional lever mechanism includes an additional projection facing the power generating element, and wherein, when the additional lever mechanism is pressed towards the additional power generating element, the additional projection applies a load to the additional power generating element.

18. The power generating apparatus according to claim 14, wherein the lever mechanism further includes an extended portion on a side of the support member opposite the power generating element, such that a pressing force on the extended portion forces the lever mechanism away from the power generating element.

19. The power generating apparatus according to claim 18, wherein the first magnetic body is disposed on the extended portion of the lever mechanism and the second magnetic body is disposed on column structure extending from the base.

20. A power generating apparatus comprising:

a planar base;

a power generating element attached to the planar base by at least one anchoring member;

a lever mechanism attached to the planar base by a support member, wherein the lever mechanism extends over the power generating element and includes a projection facing the power generating element and the lever mechanism is configured to pivot about a pivot shaft of the support member when the lever mechanism is pressed towards the power generating element;

a first magnetic body disposed on the lever mechanism; and a second magnetic body disposed on the planar base at a position to face the first magnetic body, wherein the second magnetic body has magnetic characteristics to attract the first magnetic body, wherein, when the lever mechanism is pressed towards the power generating element, the projection applies a load to the power generating element such that the power generating element generates the power.

* * * * *